(12) United States Patent
Dehe et al.

(10) Patent No.: US 9,570,659 B2
(45) Date of Patent: Feb. 14, 2017

(54) SEMICONDUCTOR DEVICE FOR EMITTING FREQUENCY-ADJUSTED INFRARED LIGHT

(71) Applicant: INFINEON TECHNOLOGIES AG, Neubiberg (DE)

(72) Inventors: Alfons Dehe, Reutlingen (DE); Stefan Kolb, Unterschleissheim (DE); Horst Theuss, Wenzenbach (DE); Dirk Meinhold, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/052,962

(22) Filed: Oct. 14, 2013

(65) Prior Publication Data

US 2015/0102372 A1 Apr. 16, 2015

(51) Int. Cl.
*H01L 33/44* (2010.01)
*H01L 33/58* (2010.01)

(52) U.S. Cl.
CPC .............. *H01L 33/44* (2013.01); *H01L 33/58* (2013.01)

(58) Field of Classification Search
CPC .................................. H01L 33/44; H01L 33/58
USPC ....... 257/98, 88, E21.502; 250/504 R, 495.1
See application file for complete search history.

(56) References Cited

U.S. PATENT DOCUMENTS

| | | | | |
|---|---|---|---|---|
| 5,616,826 A * | 4/1997 | Pellaux | ............... | G01N 21/1702 250/343 |
| 5,933,245 A * | 8/1999 | Wood | ................. | G01N 21/1702 356/246 |
| 2007/0018077 A1* | 1/2007 | Puscasu | ..................... | G01J 1/42 250/210 |
| 2007/0034978 A1* | 2/2007 | Pralle | ..................... | B82Y 20/00 257/432 |
| 2008/0152348 A1* | 6/2008 | Chen | ..................... | H04B 10/40 398/130 |
| 2012/0267532 A1* | 10/2012 | Udrea | ..................... | H05B 3/267 250/338.5 |

FOREIGN PATENT DOCUMENTS

| | | |
|---|---|---|
| CN | 1950693 A | 4/2007 |
| CN | 101303298 A | 11/2008 |
| WO | WO 2006/007446 A2 | 1/2006 |

OTHER PUBLICATIONS

San et al., "A silicon micromachined infrared emitter based on SOI wafer," vol. 6836, 2008, 8 pages.

(Continued)

*Primary Examiner* — David Vu
*Assistant Examiner* — Jonathan Han
(74) *Attorney, Agent, or Firm* — Schiff Hardin LLP (57) ABSTRACT

A semiconductor device for emitting frequency-adjusted infrared light includes a lateral emitter structure and a lateral filter structure. The lateral emitter structure is configured to emit infrared light with an emitter frequency distribution. Further, the lateral filter structure is configured to filter the infrared light emitted by the lateral emitter structure so that frequency-adjusted infrared light is provided with an adjusted frequency distribution. The frequency range of the adjusted frequency distribution is narrower than a frequency range of the emitter frequency distribution. Further, a lateral air gap is located between the lateral emitter structure and the lateral filter structure.

21 Claims, 11 Drawing Sheets

(56) References Cited

OTHER PUBLICATIONS

Dong et al., Compact Portable QEPAS Multi-Gas Sensor, vol. 7945, © 2011, 8 pages.
Florescu et al., "Improving Solar Cell Efficiency Using Photonic Band-Gap Material," www.sciencedirect.com, vol. 91, pp. 1599-1610, © 2007.
Elia et al, "Photoacoustic Techniques for Trace Gas Sensing Based on Semiconductor Laser Sources," vol. 9, pp. 9616-9628, 2009, www.mdpi.com/journal/sensors.
Firebaugh et al., "Miniaturization and Integration of Photoacoustic Detection with a Microfabricated Chemical Reactor Sysem," Journal of Microelectromechanical Systems, vol. 10, No. 2, Jun. 2001, pp. 232-237.
Harren et al., "Photoacoustic Spectroscopy in Trace Gas Monitoring", Encyclopedia of Analytical Chemistry, p. 2203-2226, © 2000.
Konz, et al., "Micromachine IR—Source with Excellent Blackbody Like Behaviour," vol. 5836, p. 540-548, © 2005.
Office Action dated Nov. 1, 2016 for Chinese Patent Application No. 201410539398.6.

\* cited by examiner

SEMICONDUCTOR DEVICE FOR EMITTING FREQUENCY-ADJUSTED INFRARED LIGHT

TECHNICAL FIELD

Embodiments relate to the generation of infrared light and in particular to a semiconductor device for emitting frequency-adjusted infrared light and a method for forming a semiconductor device.

BACKGROUND

Infrared light may be generated in various ways. For example, infrared photodiodes or infrared laser diodes may be used. Alternatively, a thermal emitter may be used for generating infrared light. An infrared emitter may require temperatures at about 600° C. to 900° C., for example. Such structures for integrated sensors have to resist high currents and high chip temperatures, for example. This may lead to high power consumption and device degradation. It is desired to reduce the power consumption and the device degradation of infrared emitters.

SUMMARY

An embodiment relates to a semiconductor device for emitting frequency-adjusted infrared light. The semiconductor device comprises a lateral emitter structure and a lateral filter structure. The lateral emitter structure is configured to emit infrared light with an emitter frequency distribution. Further, the lateral filter structure is configured to filter the infrared light emitted by the lateral emitter structure so that frequency-adjusted infrared light is provided with an adjusted frequency distribution. A frequency range of the adjusted frequency distribution is narrower than a frequency range of the emitter frequency distribution. Further, a lateral air gap is located between the lateral emitter structure and the lateral filter structure.

Due to the air gap between the lateral emitter structure and the lateral filter structure, the thermal insulation of the lateral emitter structure can be improved. In this way, less current may be necessary to heat the emitter structure to a desired temperature and the surrounding of the lateral emitter structure, especially the lateral filter structure, is less heated by the lateral emitter structure. Therefore, the current consumption may be reduced and/or the device degradation due to high temperature may be reduced.

Some embodiments relate to a semiconductor device for emitting frequency-adjusted infrared light. The semiconductor devices comprise a semiconductor substrate and a lateral emitter structure. The lateral emitter structure is configured to emit infrared light. Further, the lateral emitter structure is configured to be heated by a current flow through the lateral emitter structure. Additionally, the lateral emitter structure is structured so that frequency-adjusted infrared light is provided with an adjusted frequency distribution, if the lateral emitter structure is heated. Further, a lateral cavity is adjacent to a side of the lateral emitter structure facing the semiconductor substrate.

By implementing the emitter and the filter by the same structure, the semiconductor device can be formed with low effort. Further, the lateral cavity below the lateral emitter structure provides an improved thermal insulation of the lateral emitter structure so that a lower current may be sufficient to reach a desired temperature. In this way, the current consumption and/or the device degradation may be reduced.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
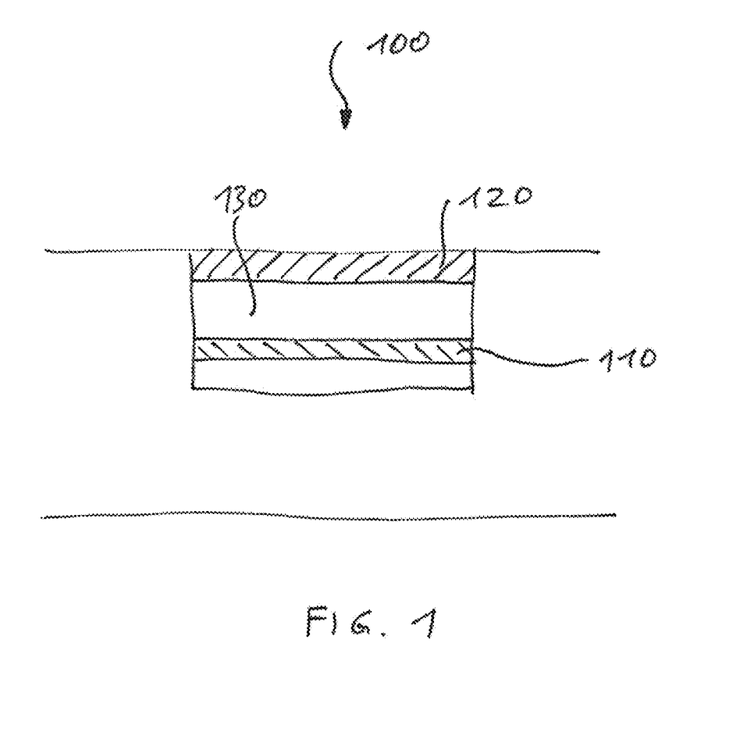
FIG. 1 shows a schematic illustration of a semiconductor device for emitting frequency-adjusted infrared light.

FIG. 1 shows a schematic cross section of a semiconductor device 100 for emitting frequency-adjusted infrared light according to an embodiment. The semiconductor device 100 comprises a lateral emitter structure 110 and a lateral filter structure 120. The lateral emitter structure 110 and the lateral filter structure 120 are vertically separated from each other by a lateral air gap 130 located between the lateral emitter structure 110 and the lateral filter structure 120. The lateral emitter structure 110 is able to emit infrared light with an emitter frequency distribution. Further, the lateral filter structure 120 filters the infrared light emitted by the lateral emitter structure 110 so that frequency-adjusted infrared light is provided with an adjusted frequency distribution. The frequency range of the adjusted frequency distribution is narrower than a frequency range of the emitter frequency distribution.

Due to the air gap between the lateral emitter structure and the lateral filter structure, the thermal insulation of the lateral emitter structure can be improved. In this way, less current may be necessary to heat the emitter structure to a desired temperature and the surrounding of the lateral emitter structure, especially the lateral filter structure, is less heated by the lateral emitter structure. Therefore, the current consumption may be reduced and/or the device degradation due to high temperature may be reduced.

The semiconductor device 100 is a device implemented on a (single) semiconductor die comprising at least a semiconductor substrate (e.g. silicon-based or silicon carbide based) and one or more insulation layers or metal layers on top of the semiconductor substrate. The lateral emitter structure 110 and/or the lateral filter structure 120 may be implemented in the semiconductor substrate or within or by one or more of the metal layers or insulation layers on top of the semiconductor substrate, for example.

The lateral emitter structure 110 may comprise one or more electrically conductive layers being heated, if a current flows through the lateral emitter structure 110. Depending on the material of the lateral emitter structure 110 and the temperature reached due to the current through the lateral emitter structure 110, infrared light is emitted with an emitter frequency distribution. In other words, infrared light emitted by the lateral emitter structure 110 comprises a frequency distribution at least depending on the temperature of the lateral emitter structure 110 and/or the material of the lateral emitter structure 110. Due to the thermal emission, a broad frequency spectrum may be obtained, for example. The emitted infrared light may comprise signal portions within a frequency range of 300 GHz to 400 THz or comprise wavelengths of 780 nm to 1 μm, for example.

Infrared light emitted by the lateral emitter structure 110 passes the lateral air gap 130 and reaches the lateral filter structure 120. The lateral filter structure 120 is implemented so that infrared light passing the lateral filter structure 120 is frequency-selectively filtered. In this way, the infrared light provided after passing the lateral filter structure 120 comprises an adjusted frequency distribution. The lateral filter structure 120 comprises a structure or is structured so that the frequency range of the infrared light emitted by the lateral emitter structure is narrowed. In other words, signal portions of at least one frequency of the emitter frequency distribution is significantly damped (e.g. by destructive interference). Consequently, the frequency range of the adjusted frequency distribution is narrower than a frequency range of the emitter frequency distribution.

In this connection, a frequency distribution is narrower than another frequency distribution, if the first frequency distribution comprises signal portions at fewer frequencies than the second frequency distribution. For this, a signal strength (e.g. light intensity) at a frequency is negligible or consider zero, if the signal strength or light intensity at a frequency is less than 10% (or less than 5% or less than 1%) of a maximal signal strength or light intensity of a frequency within the emitter frequency distribution. Further, a frequency distribution may be narrower than another frequency distribution, if the first frequency distribution comprises a smaller bandwidth (e.g. difference between maximal frequencies with non-negligible signal strength and minimal frequency with non-negligible signal strength of the frequency distribution) than the second frequency distribution, for example. For example, the lateral filter structure filters the infrared light emitted by the lateral emitter structure 110 so that a bandwidth of the adjusted frequency distribution is smaller than 50% (or smaller than 30% or smaller than 10%) of the bandwidth of the emitter frequency distribution, for example.

The lateral air gap 130 separates the lateral emitter structure 110 and the lateral filter structure 120 at least along a part of the lateral dimension or extension (e.g. within a region contributing more than 70% of the emitted infrared light) of the lateral emitter structure 110 and the lateral filter structure 120. The lateral air gap 130 may be a sealed volume (e.g. filled with a specific gas) or a volume enclosed, but not sealed from the surrounding (e.g. due to holes through the lateral filter structure), for example.

The lateral emitter structure 110, the lateral filter structure 120 and the lateral air gap 130 are lateral structures, which means that these structures comprise a larger dimension or extension in at least one lateral direction (or two lateral directions). A lateral direction may be a direction in parallel to a main surface of the semiconductor device 100.

A main surface of the semiconductor device 100 may be a semiconductor surface of the device towards metal layers, insulation layers or passivation layers on top of the semiconductor surface. In comparison to a basically vertical edge (e.g. resulting from separating the semiconductor dies from others) of the semiconductor structure, the main surface of the semiconductor structure may be a basically horizontal surface extending laterally. The main surface of the semiconductor structure may be a basically even plane (e.g. neglecting unevenness of the semiconductor structure due to the manufacturing process). In other words, the main surface of the semiconductor device 100 may be the interface between the semiconductor material and an insulation layer, metal layer or passivation layer on top of the semiconductor substrate.

In other words, a lateral direction or lateral expansion may be oriented basically in parallel to the main surface and a vertical direction or vertical expansion may be oriented basically orthogonal to the main surface.

Opposite to the lateral air gap 130, the lateral emitter structure 110 may be arranged adjacent of another layer (e.g. semiconductor substrate or insulation layer) of the semiconductor device 100. Alternatively, a cavity may be implemented at the side of the lateral emitter structure 110 opposite to the lateral air gap 130. In this way, the terminal insulation of the lateral emitter structure 110 can be further improved (as shown in FIG. 1).

The lateral filter structure 120 may be implemented in various ways. For example, the lateral filter structure 120 may comprise at least one structured layer comprising a material having a lower transparency for infrared light emitted by the lateral emitter structure 110 than silicon. In this way, portions of the emitted infrared light can be selectively damped.

For example, the lateral filter structure 120 may comprise at least one structured layer comprising at least one of the metals copper, aluminum, tungsten, titanium or titanium nitride or alternatively one of the semiconductors monocrystalline silicon or polysilicon. Due to the structured layer, the frequency distribution of the emitted infrared light can be adapted.

The lateral filter structure 120 may comprise a periodic geometry adapted to the desired adjusted frequency distribution. Due to the periodicity constructive and destructive interference can be caused at a predefined frequency or predefined frequencies for light passing the lateral filter structure. Different periodicities (e.g. distance of lines or grids) may attenuate or strengthen different frequencies or frequency portions of the emitted infrared light. In this way, the lateral filter structure 120 may implement a photonic crystal structure, for example.

Also the lateral emitter structure 110 may be implemented in various ways. For example, the lateral emitter structure 110 may comprise at least one layer comprising at least one of the metals copper, aluminum, tungsten, titanium or titanium nitride or one of the semiconductors monocrystalline silicon, or polysilicon.

The semiconductor device 100 may comprise a semiconductor substrate and the lateral emitter structure 110 may be implemented by a layer (e.g. semiconductor layer or metal layer) above or vertically separated from the semiconductor substrate (e.g. within the one or more insulation layers and metal layers). Further, a lateral cavity may be located between the lateral emitter structure 110 and the semiconductor substrate. In this way, the thermal insulation of the lateral emitter structure 110 can be improved.

Alternatively, the lateral emitter structure 110 may be represented or implemented by a layer of the semiconductor substrate (e.g. a layer arranged at the main surface of the semiconductor device) located above a lateral cavity (e.g. arranged between the lateral emitter structure and the remaining semiconductor substrate) within the semiconductor substrate, for example.

The lateral emitter structure 110 and the lateral filter structure 120 may comprise edge regions at the lateral edges in order to connect or fix the structures with the laterally surrounding part of the semiconductor device. The edge region of the lateral emitter structure 110 may be (vertically) separated from an edge region of the lateral filter structure 120 by an insulation layer laterally surrounding the lateral air gap 130, for example.

The lateral emitter structure 110 may be a membrane (e.g. extending in two orthogonal lateral directions) or a lamella (e.g. extending in one lateral direction significantly farther than in the other lateral direction). The lamella may comprise a constant or varying lateral width along the lateral air gap 130, for example. By varying the lateral width, the temperature may be varied so that infrared light with an increased frequency distribution or a broadened frequency spectrum can be provided.

The lateral air gap 130 may comprise a thickness (vertical dimension or extension) selectable in a wide range. For example, a distance between the lateral filter structure 120 and the lateral emitter structure 110 may be selected as large as possible by implementing the lateral filter structure 120 within a top metal layer (metal layer farthest away from the semiconductor substrate) and the lateral emitter structure 110 by a semiconductor layer of the semiconductor substrate or a metal layer closest to the semiconductor substrate, for example.

Alternatively, the thickness of the lateral air gap 130 may be selected so that the frequency distribution of the frequency-adjusted infrared light may be influenced. For example, the lateral air gap may comprise a thickness of a quarter of a wavelength of a portion of the frequency-adjusted infrared light (e.g. Fabry-Perot filter structure).

Figure 2:
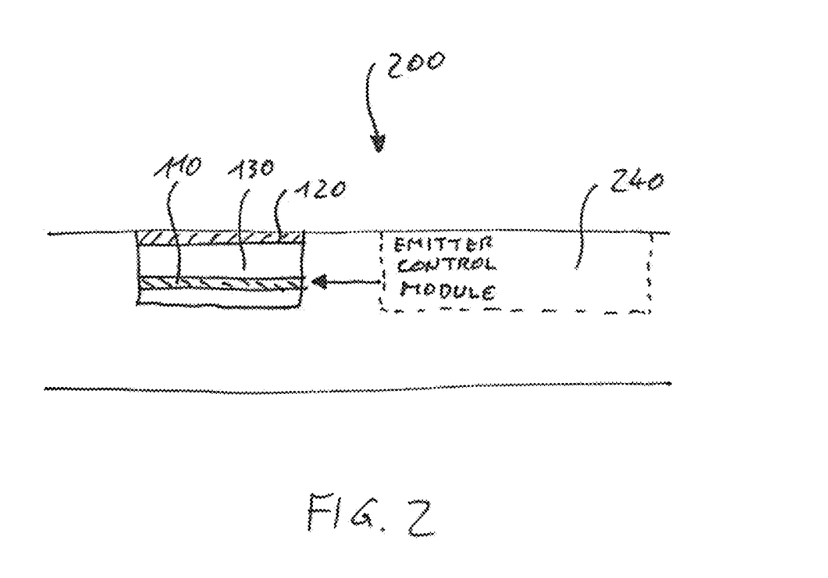
FIGS. 2 to 7 show further semiconductor devices.

FIG. 2 shows a schematic cross section of a semiconductor device 200 for emitting frequency-adjusted infrared light according to an embodiment. The implementation of the semiconductor device 200 is similar to the implementation shown in FIG. 1. Additionally, the semiconductor device 200 comprises an emitter control module 240. The emitter control module 240 may provide a current led through the lateral emitter structure 110 causing an infrared light emission. In other words, the emitter module 240 may control a current strength and temporal occurrence of a current through the lateral emitter structure 110. In this way, the emitter control module 230 may control the time infrared light is emitted by the lateral emitter structure 110 and at least partly a frequency distribution of the light emitted by the lateral emitter structure 110 (e.g. different current strength may result in different temperatures of the lateral emitter structure).

The emitter control module 240 may be arranged on the same semiconductor die as the lateral emitter structure at 110 and the lateral filter structure 120 as shown in FIG. 2. Alternatively, such an emitter control module may be implemented on another semiconductor die connected to the semiconductor device comprising the lateral emitter structure and the lateral filter structure 120. More details and aspects are explained in connection with FIG. 1.

Figure 3:
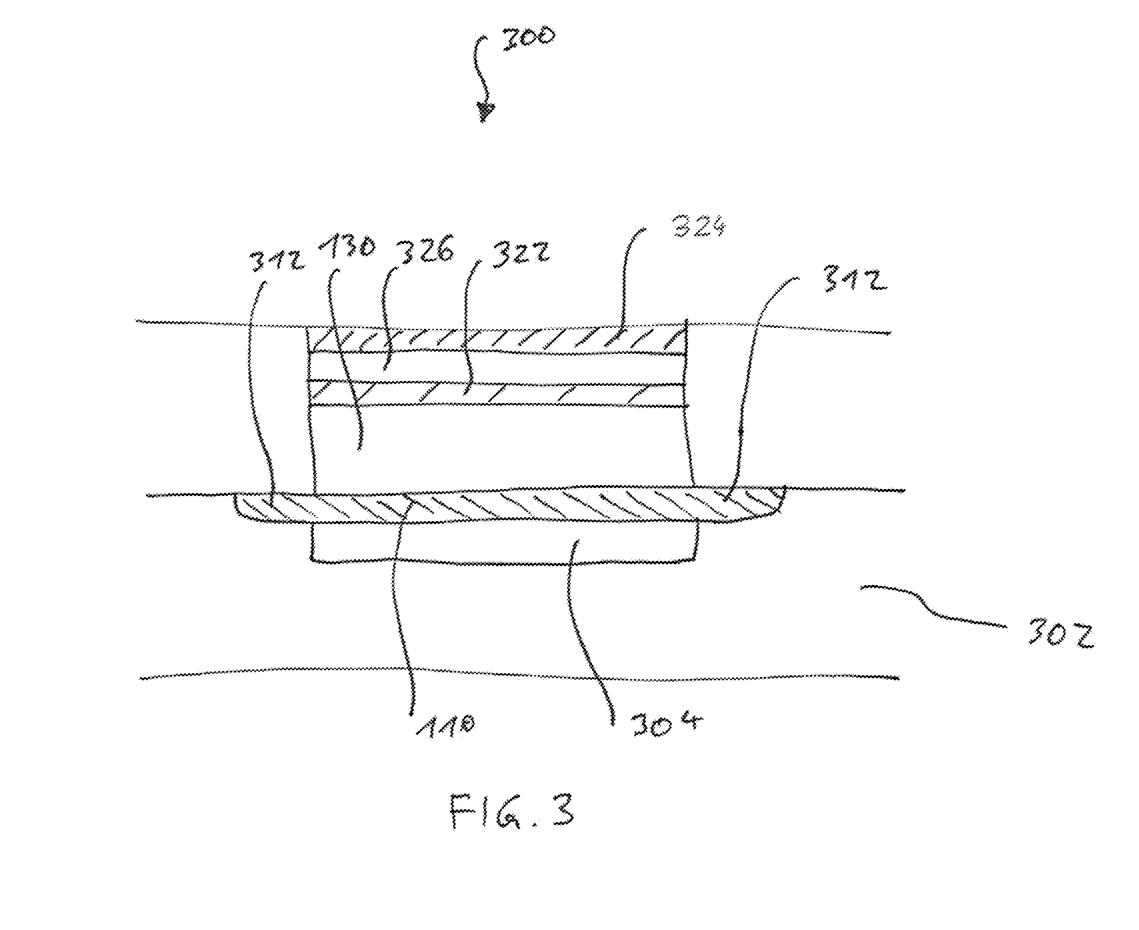

FIG. 3 shows a schematic cross-section of a semiconductor device 300 for emitting frequency-adjusted infrared light according to an embodiment. The implementation of the semiconductor device 300 is similar to the implementation shown in FIG. 1 or 2. In this case, the semiconductor device 300 comprises a semiconductor substrate 302 and the lateral emitter structure 110 is represented or implemented by a layer of the semiconductor substrate located above a lateral cavity 304 within the semiconductor substrate 302. The layer implementing the lateral emitter structure 110 may comprise a conductivity type (p- or n-doping) different from a conductivity type (n- or p-doping) of the surrounding semiconductor substrate 302 in order to enable a controlled current flow through the lateral emitter structure 110, for example. For this, the layer implementing the lateral emitter structure 110 may laterally extend beyond the cavity 304 into the semiconductor substrate 302 representing an edge region 312 of the lateral emitter structure 110, for example.

Optionally, additionally or alternatively to one or more aspects mentioned above, the lateral filter structure may comprise a first layer 322 comprising a structure with a first periodic geometry and a second layer comprising a second periodic geometry. The first periodic geometry may be different from the second periodic geometry (e.g. different distances of lines or grids). In this way, the bandwidth of the frequency-adjusted infrared light can be further reduced or frequency-adjusted infrared light with signal portions in different narrow frequency bands can be provided, for example.

An insulation layer (e.g. silicon oxide) may be arranged between the first layer 322 and the second layer 324 of the lateral filter structure. Alternatively, the lateral filter structure may comprise a lateral air gap 326 between the first layer 322 and the second layer 324. In this way, a thermal coupling between the first layer 322 and the second layer 324 of the lateral filter structure can be reduced, for example.

Figure 4:
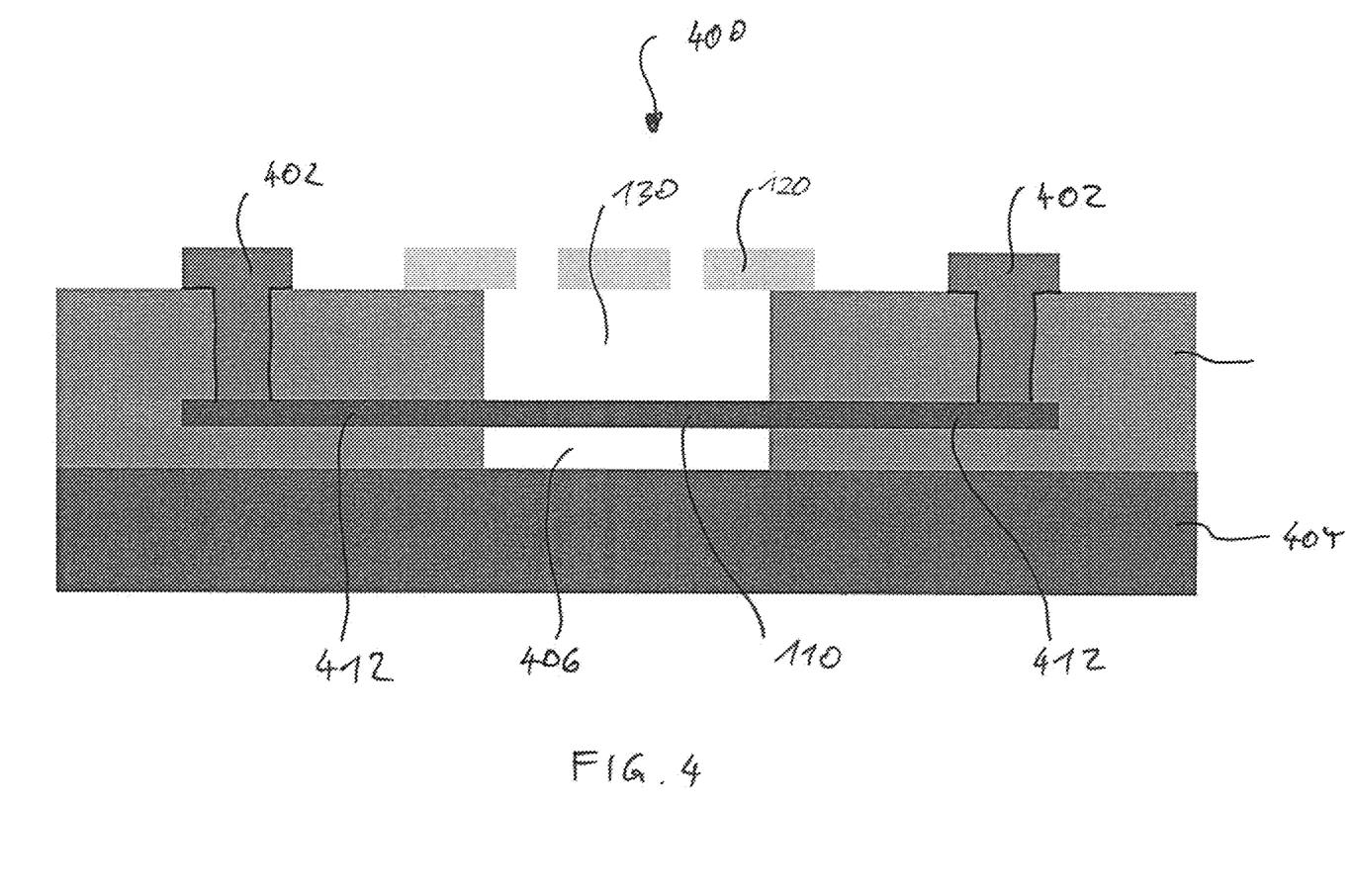

FIG. 4 shows a schematic cross-section of a semiconductor device 400 for emitting frequency-adjusted infrared light according to an embodiment. The implementation of the semiconductor device 400 is similar to the implementation shown in FIG. 1. The semiconductor device 400 comprises a semiconductor substrate 404 and a lateral emitter structure 110 (e.g. IR-emitter filament) arranged within a metal layer (e.g. copper, aluminum, tungsten, titan or titan nitride) or a semiconductor layer (e.g. monocrystalline silicon or poly silicon) separated from the semiconductor substrate 404 by a cavity 406. The lateral emitter structure 110 comprises edge regions 412 surrounding the part of the lateral emitter structure 110 mainly (more than 50% of the light intensity) contributing to the emitted infrared light laterally extending into insulating material (e.g. silicon dioxide) formed by insulating layers, for example. The lateral emitter structure 110 is electrically connected at opposite sides within the edge region 412 by electrical contacts 402 (e.g. vias, filament contact) to be connected to an external current source or connected to an emitter control module on the same semiconductor die. The lateral filter structure 120 (e.g. photonic crystal filter) is located above the lateral emitter structure 110 vertically separated from the lateral emitter structure 110 by the lateral air gap 130. More details and aspects are explained in connection with FIGS. 1 to 3.

FIG. 4 may implement an infrared (IR) emitter with integrated filter. The filter may be arranged with distance to the infrared emitter.

Figure 5:
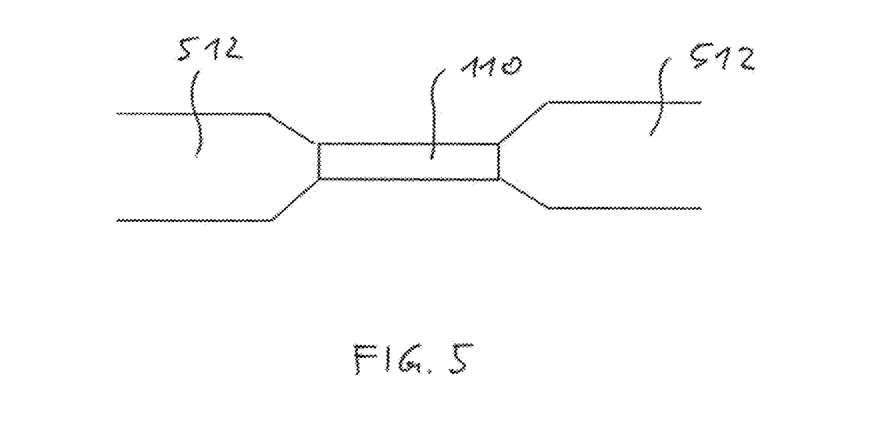

As already mentioned, the lateral emitter structure may be implemented by a lamella comprising a constant lateral width (e.g. at least within a region mainly contributing to an emission of infrared light). FIG. 5 shows a schematic top view of a lateral emitter structure 110 with constant lateral width and connecting regions 512 or edge region at opposite sides of the lateral emitter structure 110 for leading current through the lateral emitter structure 110.

In this way, an infrared (IR) emitter structure improved or optimized for low heat dissipation may be provided, for example.

Figure 6:
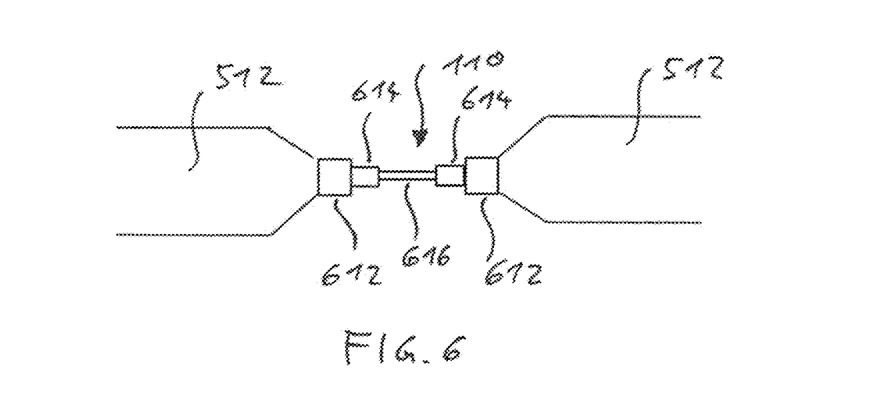

Alternatively, the lateral emitter structure 110 may be implemented by a lamella with varying lateral width along the lateral air gap 130, for example. FIG. 6 shows a schematic top view of a lateral emitter structure 110 with varying lateral width and connecting regions at opposite ends of the lateral emitter structure 110 for enabling a current flow through the lateral emitter structure 110. The lateral emitter structure 110 comprises a first lateral width over a first lateral portion 612, a second lateral width over a second lateral portion 614 and a third lateral width within a center portion 616. The first width is larger than the second width and the second width is larger than the third width, for example.

Since the same current is led through the different portions, the current density and consequently the temperature is different within the different portions so that infrared light with different spectra is emitted by the different portions resulting in an infrared (IR) emitter structure for a broad radiation spectrum, for example.

Alternatively, also circular shapes (e.g. two half circles being in contact at the circumference in the middle of the lateral emitter structure) of a top view of the lateral emitter structure or a funnel-shaped top view with decreasing lateral width from an edge of the lateral emitter structure to the middle of the lateral emitter structure and an increasing width from the middle of the lateral emitter structure to the other end of the lateral emitter structure may be possible, for example. In this way, a continuous variation of the temperature of the lateral emitter structure 110 may be obtained.

Figure 7:
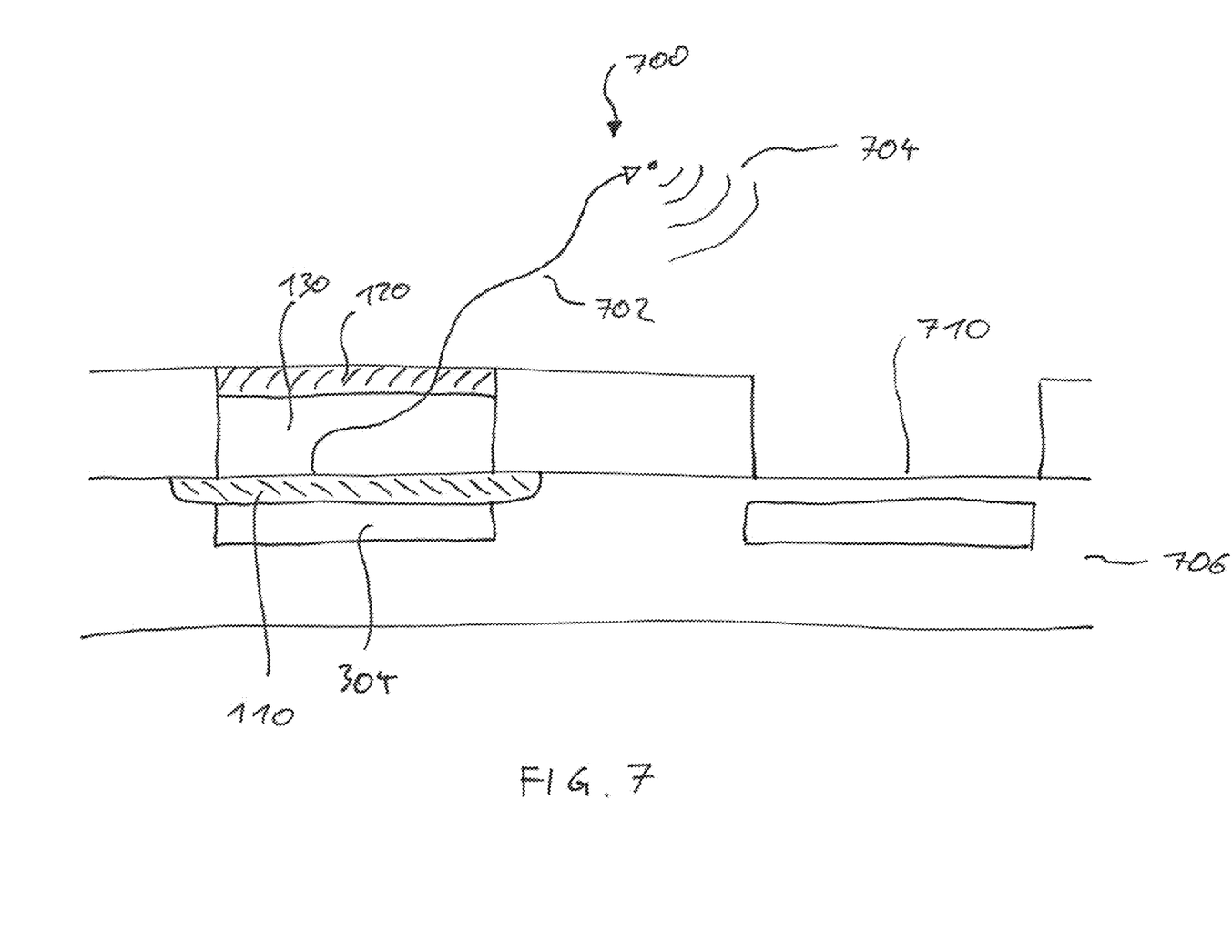

FIG. 7 shows a schematic cross-section of a semiconductor device 700 for emitting frequency-adjusted infrared light according to an embodiment. The implementation of the semiconductor device 700 is similar to the implementation shown in FIG. 1 or 4. Additionally, the semiconductor device 700 comprises a pressure-sensitive module 710 (e.g. comprising a movable membrane or a piezoelectric element) generating a sensor signal indicating information on an acoustic wave 704 caused by infrared light 702 emitted by the lateral emitter structure 110 (and filtered by the lateral filter structure) interacting with gas (e.g. gas to be analyzed).

The semiconductor technologies for forming pressure-sensitive modules (e.g. microphone module) and emitter structures according to the proposed concept may be similar (e.g. micro electromechanical system technology). Therefore, these structures may be implemented with low effort on a common semiconductor die.

In FIG. 7, the lateral emitter structure 110 is implemented by a layer of the semiconductor substrate 706 arranged above a cavity 304. Further, the pressure-sensitive module 710 comprises at least a membrane implemented by a layer of the semiconductor substrate 706 arranged above a cavity within the semiconductor substrate 706.

The membrane is accessible by acoustic waves caused by infrared light 702 interacting with gas in the proximity of the semiconductor device 700.

The semiconductor device 700 may be used for implementing a photoacoustic gas sensor device, for example.

Figure 8A:
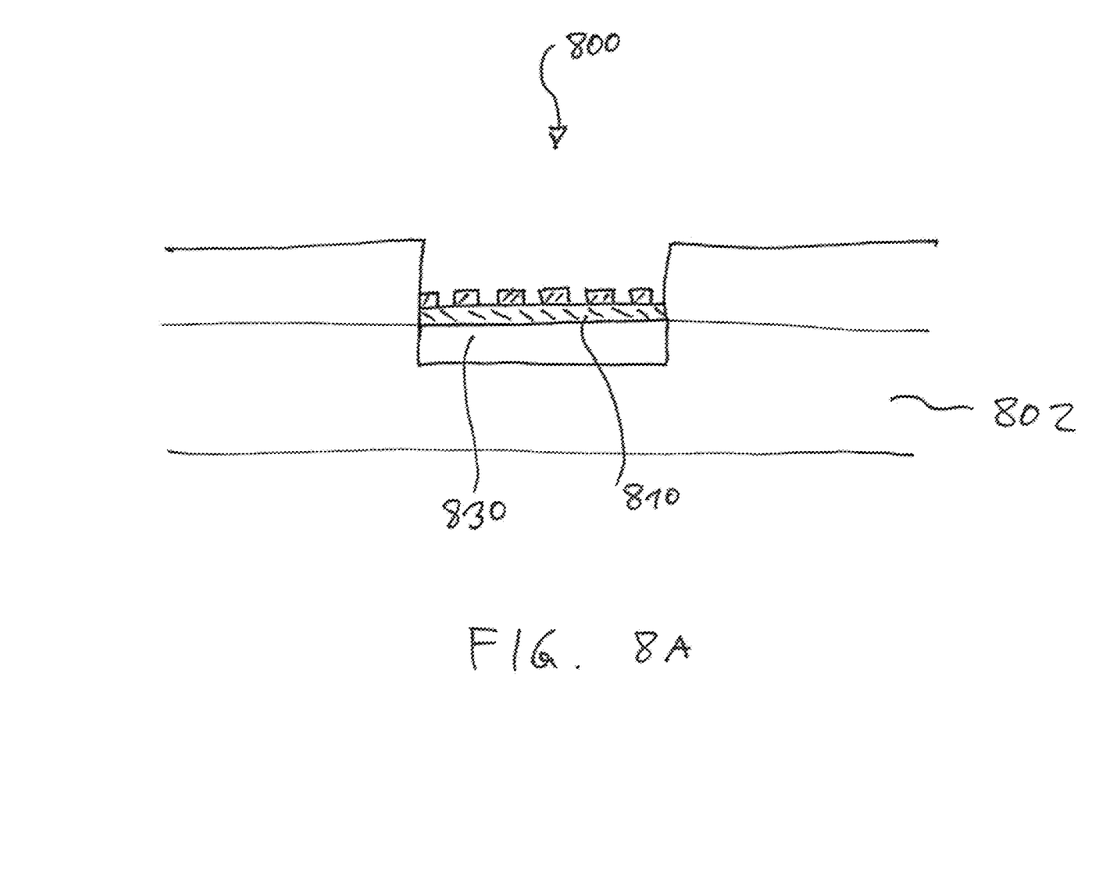
FIGS. 8A-8C show schematic illustrations of semiconductor devices for emitting frequency-adjusted infrared light.

FIG. 8A shows a schematic cross-section of a semiconductor device 800 for emitting frequency-adjusted infrared light according to an embodiment. The semiconductor device 800 comprises a semiconductor substrate 802 and a lateral emitter structure 810. The lateral emitter structure is configured to emit infrared light. Further, the lateral emitter structure 810 is configured to be heated by a current flow through the lateral emitter structure 810. Additionally, the lateral emitter structure 810 is structured so that frequency-adjusted infrared light is provided with an adjusted frequency distribution, if the lateral emitter structure 810 is heated. Further, a lateral cavity 830 is adjacent to a side of the lateral emitter structure 810 facing the semiconductor substrate 802.

By implementing the emitter and the filter by the same structure, the semiconductor device can be formed with low effort. Further, the lateral cavity below the lateral emitter structure provides an improved thermal insulation of the lateral emitter structure so that a lower current may be sufficient to reach a desired temperature. In this way, the current consumption and/or the device degradation may be reduced.

A frequency adjusted or adapted infrared light may be infrared light with a frequency distribution or frequency spectrum different from a black body spectrum or different from a spectrum of an emitter structure without a frequency adaptive structuring, for example.

The lateral cavity 830 may be located between the lateral emitter structure and at least a part of the semiconductor substrate 802.

For example, the lateral emitter structure 810 comprises an emitter layer adjacent to a filter layer as indicated in FIG. 8A. The emitter layer is configured to be heated by a current flow through the emitter layer. Further, the filter layer is implemented so that frequency-adjusted infrared light is provided with an adjusted frequency distribution, if the emitter layer is heated.

The lateral emitter structure may be implemented by a composite structure of the emitter layer and the filter layer or the emitter layer and the filter layer comprise the same material (e.g. the filter layer is formed by implementing a structured surface of the lateral emitter structure), for example.

The frequency range of the adjusted frequency distribution may be narrower than a frequency range of a frequency distribution of infrared light obtained by an emitter comprising only the emitter layer (without the filter layer), for example.

A current flow through the lateral emitter structure may be mainly located within the emitter layer (e.g. more than 50%, more than 70% or more than 90% of the current). However, a part of the current may also flow through the filter layer (e.g. depending on the geometry of the filter layer) contributing to the heating of the lateral emitter structure, for example.

The emitter layer being adjacent to the filter layer may mean that the emitter layer is directly followed by or in direct contact with the filter layer.

More details or aspects are explained in connection with the proposed concept or one or more embodiments described above (e.g. FIGS. 1 to 7).

For example, the lateral emitter structure may be represented by a layer of the semiconductor substrate 802 located above a lateral cavity 830 within the semiconductor substrate (e.g. similar to FIG. 3). Alternatively, the lateral emitter structure may be implemented by a layer above the semiconductor substrate 802. The lateral cavity 830 may be located between the lateral emitter structure and the semiconductor structure 802 (e.g. similar to FIG. 1).

Further, the lateral emitter structure may be shaped according to the examples mentioned in connection with FIGS. 5 and 6, for example. Further, a pressure-sensitive module may be implemented on the same semiconductor die so that a photoacoustic gas sensor device may be implemented. In other words, various emitter designs may be possible.

Figure 8B:
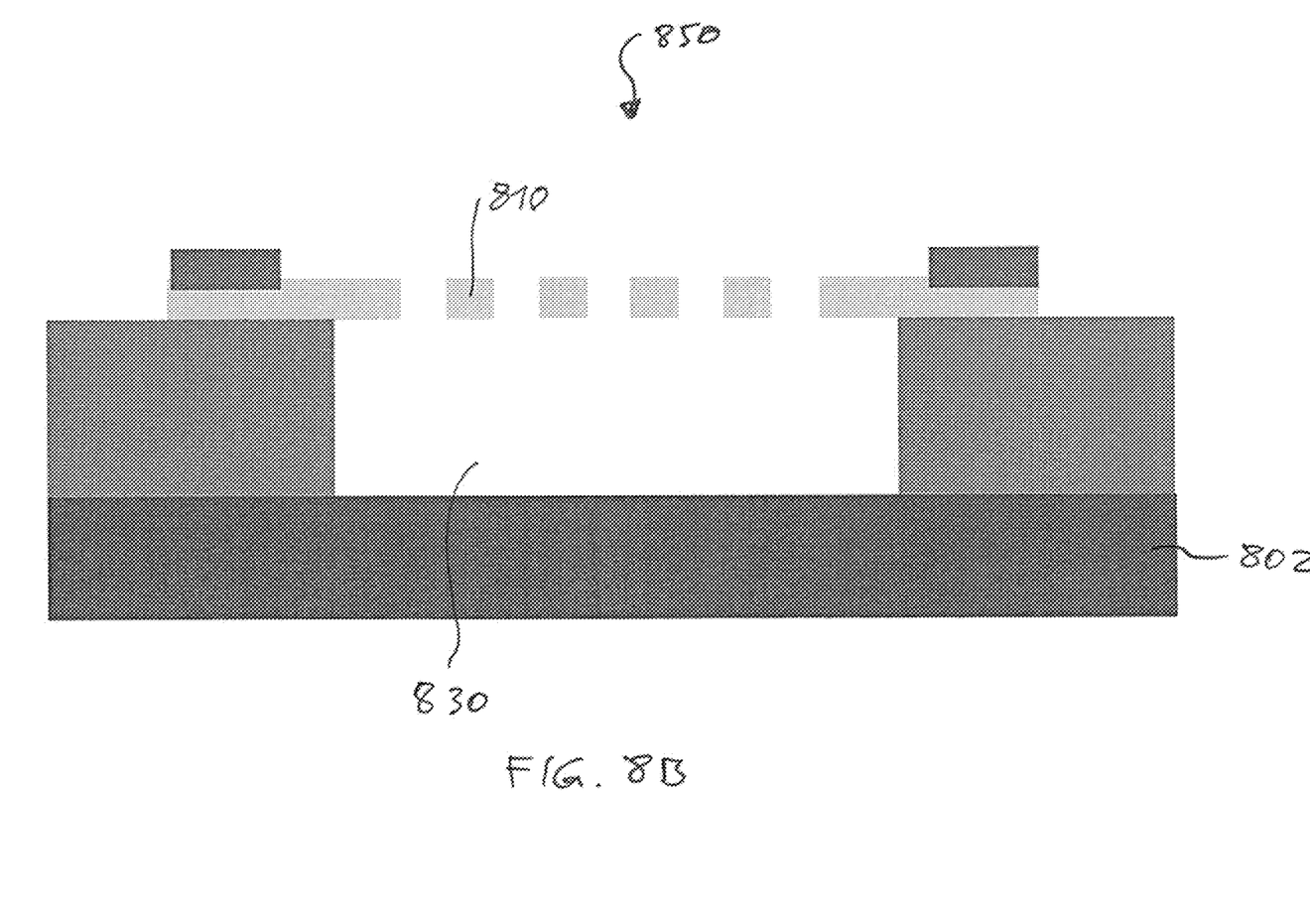

Alternatively, the lateral emitter structure comprises periodic vertical holes through the lateral emitter structure.

FIG. 8B shows a schematic cross-section of a semiconductor device 850 for emitting frequency-adjusted infrared light according to an embodiment. The implementation of the semiconductor device 850 is similar to the implementation shown in FIG. 8A. However, the lateral emitter structure 810 comprises periodic vertical holes through the lateral emitter structure 810 for adjusting the frequency distribution of the emitted infrared light. More details and aspects are described in connection with FIG. 8A, for example.

Figure 8C:
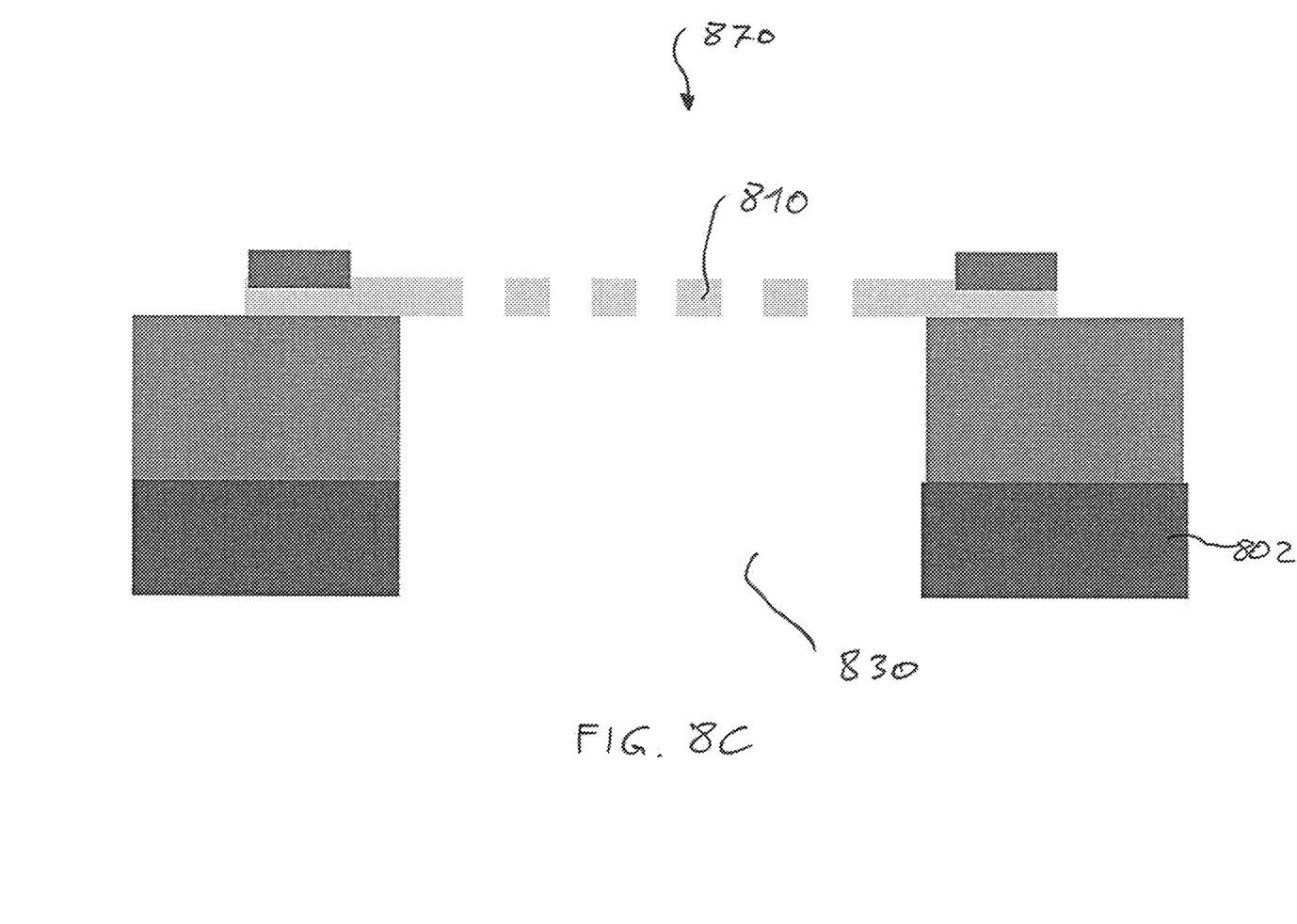

FIG. 8C shows a schematic cross-section of a semiconductor device 870 for emitting frequency-adjusted infrared light according to an embodiment. The implementation of the semiconductor device 870 is similar to the implementation shown in FIG. 8B. However, the lateral cavity 830 reaches vertically through the whole semiconductor substrate 802. More details and aspects are described in connection with FIGS. 8A and 8B, for example.

Figure 9:
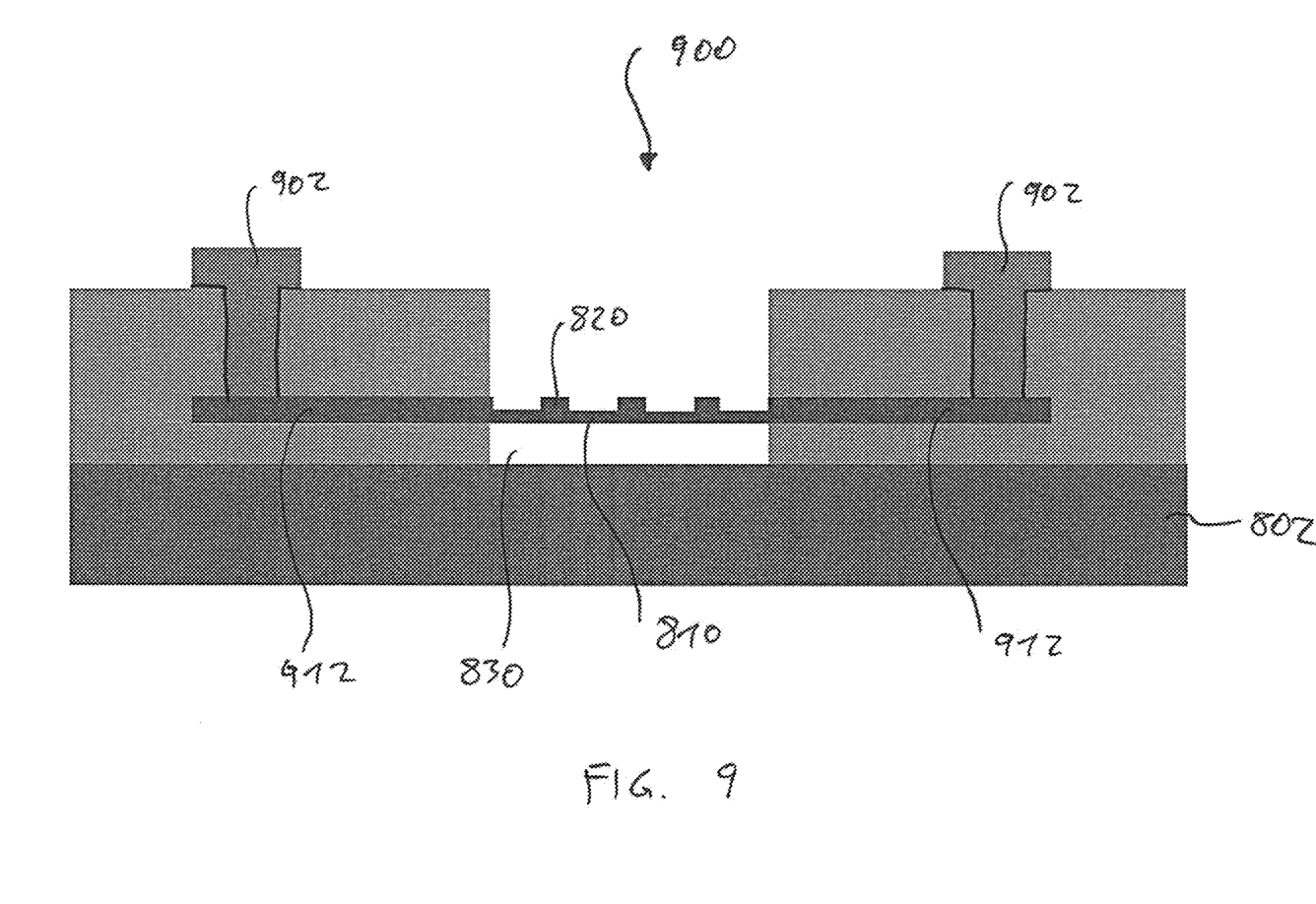
FIGS. 9 and 10 show schematic illustrations of further semiconductor devices.

FIG. 9 shows a schematic cross-section of a semiconductor device 900 for emitting frequency-adjusted infrared light according to an embodiment. The implementation of the semiconductor device 900 is similar to the implementation shown in FIGS. 8B and 4. However, the lateral emitter structure 810 is structured only at a surface opposite to the semiconductor substrate 802 without holes through the whole lateral emitter structure 810. In other words, the emitter layer and the filter layer shown in FIG. 8A are implemented in one piece and comprise the same material. The semiconductor device 900 comprises a semiconductor substrate 802 and a lateral emitter structure 810 (e.g. IR-emitter filament) arranged within a metal layer (e.g. copper, aluminum, tungsten, titan or titan nitride) or a semiconductor layer (e.g. monocrystalline silicon or poly silicon) separated from the semiconductor substrate 802 by a cavity 830. The lateral emitter structure 810 comprises edge regions 912 surrounding the part of the lateral emitter structure 810 mainly (more than 50% of the light intensity) contributing to the emitted infrared light laterally extending into insulating material (e.g. silicon dioxide) formed by insulating layers, for example. The lateral emitter structure 810 is electrically connected at opposite sides within the edge region 912 by electrical contacts 902 (e.g. vias, filament contact) to be connected to an external current source or connected to an emitter control module on the same semiconductor die. More details and aspects are described in connection with the embodiments above.

FIG. 9 shows an example for an infrared (IR) emitter with integrated filter. The filter is arranged on the infrared emitter, for example.

Figure 10:
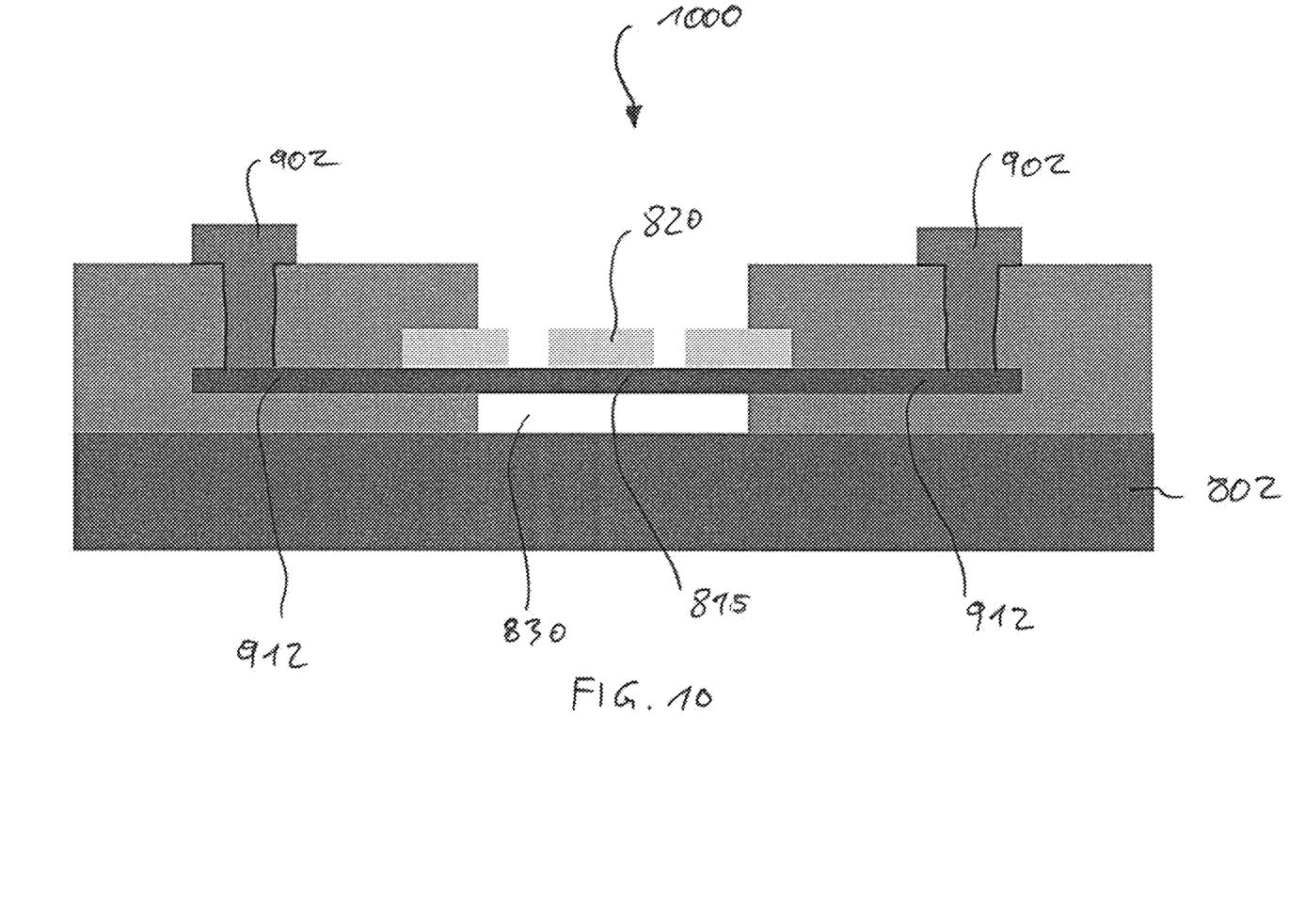

FIG. 10 shows a schematic cross-section of a semiconductor device 1000 emitting frequency-adjusted infrared light according to an embodiment. The implementation of the semiconductor device 1000 is similar to the implementation shown in FIG. 9. However, the emitter layer 815 and the filter layer 820 are independent from each other and arranged directly adjacent to each other. In this way, different materials may be selected for the emitter layer 815 and the filter layer 820, for example. More details and aspects are explained in connection with one or more embodiments described above.

FIG. 10 shows an example for an infrared (IR) emitter with integrated filter. The filter is arranged on the infrared emitter, for example.

Some embodiments relate to an infrared emitter or an infrared emitter with integrated filter. MEMS (Micro-Electromechanical System) processes may be used to make a good thermal insulation between infrared (IR) emitter and surrounding chip, for example. This may result in low power consumption and the feasibility of integration of IR emitter with circuitry, for example.

In other words, an IR emitter may be implemented by a combination with MEMS cavities. A photonic crystal may be integrated and placed above the filament. An easy integration in silicon technology and in combination with a circuitry may be possible.

Multiple filters for different wavelengths may be used. For example, a low-pass filter, a high-pass filter or a band-pass filter may be implemented. The filter structure may be implemented in silicon or metal, for example.

The structure (emitter structure) may be released with MEMS (e.g. released by using micro-electromechanical system technology) for thermal decoupling. A metal structure for the filter may be used for thermal decoupling (e.g. by separation by an air gap).

A proposed concept can be implemented with MEMS processes (e.g. polyfilament, oxide sacrificial layer SL, metal filament, epi (epitaxy) filament and sacrificial layer, venetia-process, carbon hard mask).

Further, the distance (between emitter structure and filter structure) may be adjusted to a quarter of the wavelength ($\lambda/4$) to generate a Fabry-Perot filter structure, for example.

Figure 11:
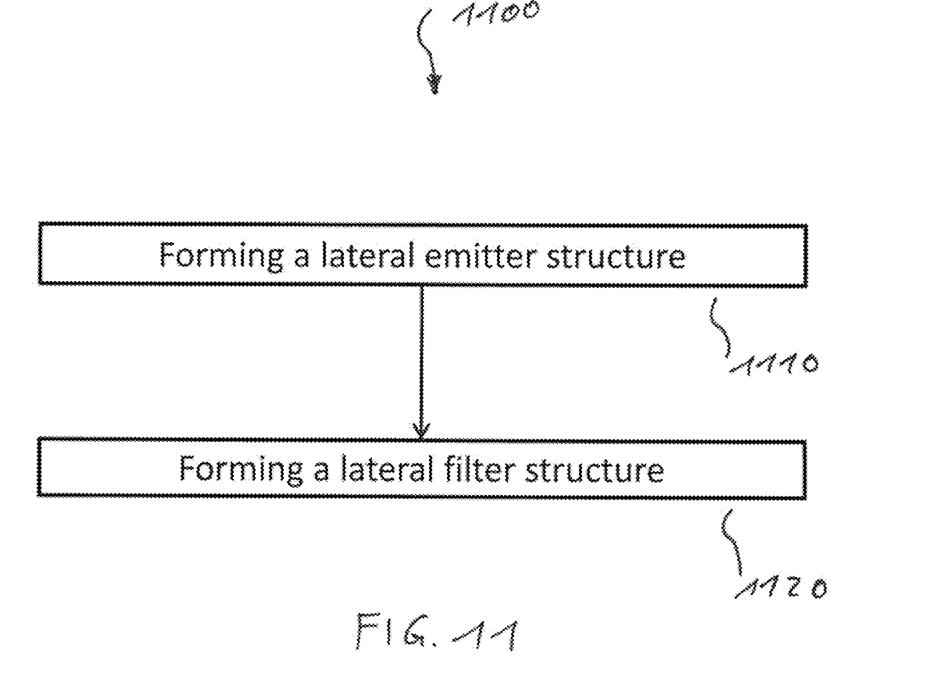
FIG. 11 shows a flowchart of a method for forming a semiconductor device.

FIG. 11 shows a flowchart of a method 1100 for forming a semiconductor device according to an embodiment. The method 1100 comprises forming 1110 a lateral emitter structure configured to emit infrared light with an emitter frequency distribution. Further, the method 1100 comprises forming 1120 a lateral filter structure configured to filter the infrared light emitted by the lateral emitter structure so that frequency-adjusted infrared light is provided with an adjusted frequency distribution. A frequency range of the adjusted frequency distribution is narrower than a frequency range of the emitted frequency distribution. Further, a lateral air gap is located between the lateral emitter structure and the lateral filter structure.

In this way, a proposed semiconductor device may be implemented with low effort.

The method 1100 may comprise one or more optional additional acts corresponding to one or more aspects mentioned in connection with the proposed concept or one or more embodiments described above.

Figure 12:
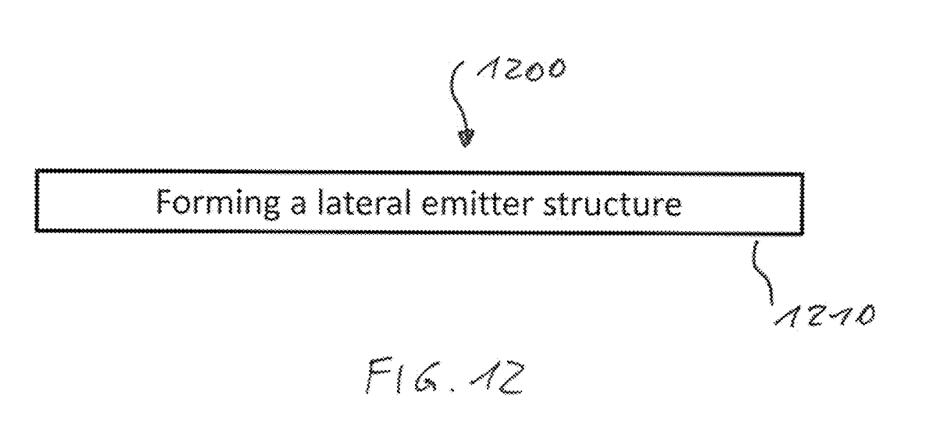
FIG. 12 shows a flowchart of a method for forming a semiconductor device.

FIG. 12 shows a flowchart of a method 1200 for forming a semiconductor device according to an embodiment. The method 1200 comprises forming 1210 a lateral emitter structure configured to emit infrared light. The lateral emitter structure is configured to be heated by a current flow through the lateral emitter structure. Additionally, the lateral emitter structure is structured so that frequency-adjusted infrared light is provided with an adjusted frequency distribution, if the lateral emitter structure is heated. Further, a lateral cavity is adjacent to a side of the lateral emitter structure facing the semiconductor substrate.

In this way, a proposed semiconductor device can be implemented with low effort.

The method 1200 may comprise one or more optional additional acts corresponding to one or more optional aspects mentioned in connection with the proposed concept or one or more embodiments described above.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device for emitting frequency-adjusted infrared light comprising:
a lateral emitter structure of the semiconductor device configured to emit infrared light with an emitter frequency distribution;
a lateral filter structure of the semiconductor device configured to filter the infrared light emitted by the lateral emitter structure so that frequency-adjusted infrared light is provided with an adjusted frequency distribution, wherein a frequency range of the adjusted frequency distribution is narrower than a frequency range of the emitter frequency distribution; and
a lateral air gap located between the lateral emitter structure and the lateral filter structure.

2. The semiconductor device according to claim 1, wherein the lateral filter structure comprises a structured layer comprising a material having a lower transparency for infrared light emitted by the lateral emitter structure than silicon.

3. The semiconductor device according to claim 1, wherein the lateral filter structure comprises a structured layer comprising at least one of the metals copper, aluminum, tungsten, titan or titan nitride or one of the semiconductors monocrystalline silicon or poly silicon.

4. The semiconductor device according to claim 1, wherein the lateral emitter structure comprises a layer comprising at least one of the metals copper, aluminum, tungsten, titan or titan nitride or one of the semiconductors monocrystalline silicon or poly silicon.

5. The semiconductor device according to claim 1, comprising an emitter control module configured to provide a current led through the lateral emitter structure causing an infrared light emission.

6. The semiconductor device according to claim 5, comprising a semiconductor substrate, wherein the lateral emitter structure is implemented by a layer of the semiconductor substrate located above a lateral cavity within the semiconductor substrate.

7. The semiconductor device according to claim 1, comprising a semiconductor substrate, wherein the lateral emitter structure is implemented by a layer above the semiconductor substrate, wherein a lateral cavity is located between the lateral emitter structure and the semiconductor substrate.

8. The semiconductor device according to claim 1, wherein an edge region of the lateral emitter structure is vertically separated from an edge region of the lateral filter structure by an electrical insulation layer laterally surrounding the lateral air gap.

9. The semiconductor device according to claim 1, wherein the lateral emitter structure is a membrane or the lateral emitter structure is a lamella with constant or varying lateral width along the lateral air gap.

10. The semiconductor device according to claim 1, wherein the lateral filter structure comprises a first layer comprising structures with a first periodic geometry and a second layer comprising a second periodic geometry, wherein the first periodic geometry is different from the second periodic geometry.

11. The semiconductor device according to claim 10, wherein the lateral filter structure comprises a lateral air gap between the first layer and the second layer.

12. The semiconductor device according to claim 1, wherein the lateral air gap comprises a thickness of a quarter of a wavelength of a portion of the frequency-adjusted infrared light.

13. The semiconductor device according to claim 1, comprising a pressure sensitive module configured to generate a sensor signal indicating information on an acoustic wave caused by infrared light emitted by the lateral emitter structure interacting with gas.

14. The semiconductor device according to claim 1, wherein the lateral emitter structure and the lateral filter structure are arranged on the same semiconductor die.

15. A semiconductor device for emitting frequency-adjusted infrared light comprising:
a semiconductor substrate;
a lateral emitter structure configured to emit infrared light, wherein the lateral emitter structure is configured to be heated by a current flow through the lateral emitter structure,
wherein the lateral emitter structure is structured so that frequency-adjusted infrared light is provided with an adjusted frequency distribution, if the lateral emitter structure is heated; and
a lateral cavity adjacent to a side of the lateral emitter structure facing the semiconductor substrate.

16. The semiconductor device according to claim 15, wherein the lateral cavity is located between the lateral emitter structure and at least a part of the semiconductor substrate.

17. The semiconductor device according to claim 15, wherein the lateral emitter structure comprises an emitter layer adjacent to a filter layer, wherein the emitter layer is configured to be heated by a current flow through the emitter layer, wherein the filter layer is configured so that frequency-adjusted infrared light is provided with an adjusted frequency distribution, if the emitter layer is heated.

18. The semiconductor device according to claim 17, wherein a frequency range of the adjusted frequency distribution is narrower than a frequency range of a frequency distribution of infrared light obtained by an emitter comprising only the emitter layer.

19. The semiconductor device according to claim 17, wherein the emitter layer and the filter layer comprise the same material.

20. The semiconductor device according to claim 17, wherein the lateral emitter structure is represented by a layer of the semiconductor substrate located above the lateral cavity within the semiconductor substrate, or wherein the lateral emitter structure is implemented by a layer above the semiconductor substrate, wherein the lateral cavity is located between the lateral emitter stricture and the semiconductor substrate.

21. The semiconductor device according to claim 15, wherein the lateral emitter structure comprises periodic vertical holes through the lateral emitter structure.

* * * * *